United States Patent
Kooiman et al.

(10) Patent No.: US 11,016,399 B2
(45) Date of Patent: May 25, 2021

(54) METHOD FOR CONTROLLING A MANUFACTURING APPARATUS AND ASSOCIATED APPARATUSES

(71) Applicant: ASML NETHERLANDS B.V., Veldhoven (NL)

(72) Inventors: Marleen Kooiman, Eindhoven (NL); Sander Frederik Wuister, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/765,595

(22) PCT Filed: Dec. 10, 2018

(86) PCT No.: PCT/EP2018/084109
§ 371 (c)(1),
(2) Date: May 20, 2020

(87) PCT Pub. No.: WO2019/115431
PCT Pub. Date: Jun. 20, 2019

(65) Prior Publication Data
US 2020/0310254 A1 Oct. 1, 2020

(30) Foreign Application Priority Data
Dec. 14, 2017 (EP) .................................... 17207267

(51) Int. Cl.
*G03F 7/20* (2006.01)
*G01N 21/956* (2006.01)

(52) U.S. Cl.
CPC ....... *G03F 7/70633* (2013.01); *G01N 21/956* (2013.01); *G03F 7/20* (2013.01); *G03F 7/70625* (2013.01)

(58) Field of Classification Search
CPC ............ G03F 7/70633; G03F 7/70625; G01N 21/956
(Continued)

(56) References Cited

U.S. PATENT DOCUMENTS

| 2001/0026948 A1 | 10/2001 | Nakayoshi et al. |
| 2001/0026949 A1* | 10/2001 | Ogawa ................... H01L 22/20 438/15 |

(Continued)

FOREIGN PATENT DOCUMENTS

| EP | 2133746 | 12/2009 |
| WO | 2009078708 | 6/2009 |

(Continued)

OTHER PUBLICATIONS

International Search Report and Written Opinion issued in corresponding PCT Patent Application No. PCT/EP2018/084109, dated Mar. 29, 2019.

*Primary Examiner* — Hung Nguyen
(74) *Attorney, Agent, or Firm* — Pillsbury Winthrop Shaw Pittman LLP

(57) ABSTRACT

A method of predicting the dominant failure mode and/or the failure rate of a plurality of features formed on a substrate, and an associated inspection apparatus. The method may include determining a placement metric for each feature, the placement metric including a measure of whether the feature is in an expected position, and comparing a distribution of the placement metric to a reference (e.g., Gaussian) distribution. The placement metric may include a boundary metric for a plurality of boundary points on a boundary defining each feature, the boundary metric including a measure of whether a boundary point is in an expected position. The dominant failure mode and/or the failure rate of the plurality of features is predicted from the comparison.

20 Claims, 3 Drawing Sheets

(58) Field of Classification Search
    USPC ........................................ 355/52, 53, 55, 77
    See application file for complete search history.

(56) References Cited

U.S. PATENT DOCUMENTS

| | | |
|---|---|---|
| 2006/0033921 A1 | 2/2006 | Den Boef et al. |
| 2006/0066855 A1 | 3/2006 | Den Boef et al. |
| 2007/0288219 A1* | 12/2007 | Zafar .................. G06T 7/0008 703/14 |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0035888 A1 | 2/2013 | Kandel et al. |
| 2013/0258310 A1 | 10/2013 | Smilde et al. |
| 2013/0271740 A1 | 10/2013 | Quintanilha |

FOREIGN PATENT DOCUMENTS

| | | |
|---|---|---|
| WO | 2009106279 | 9/2009 |
| WO | 2013178422 | 12/2013 |
| WO | 2016087069 | 6/2016 |

\* cited by examiner

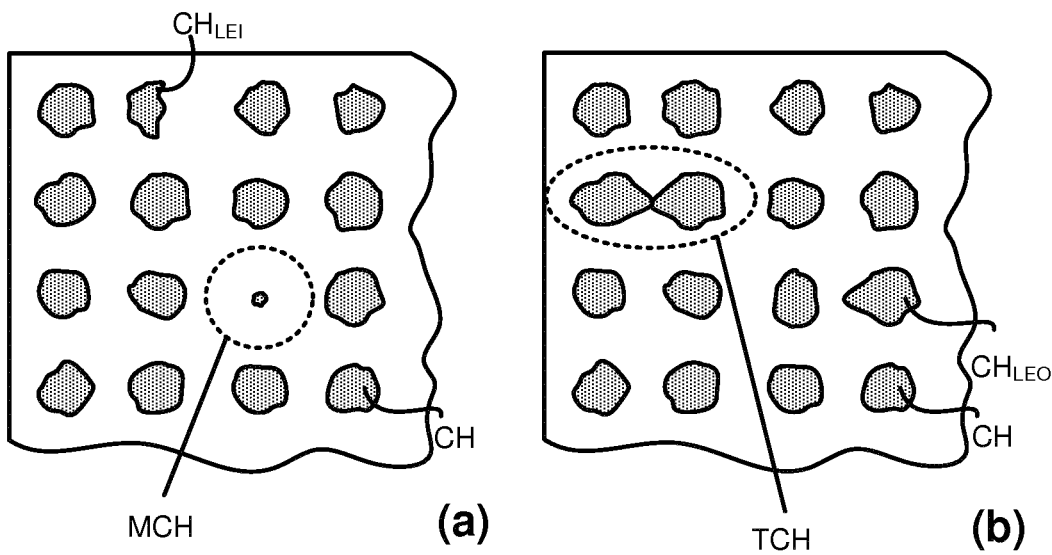
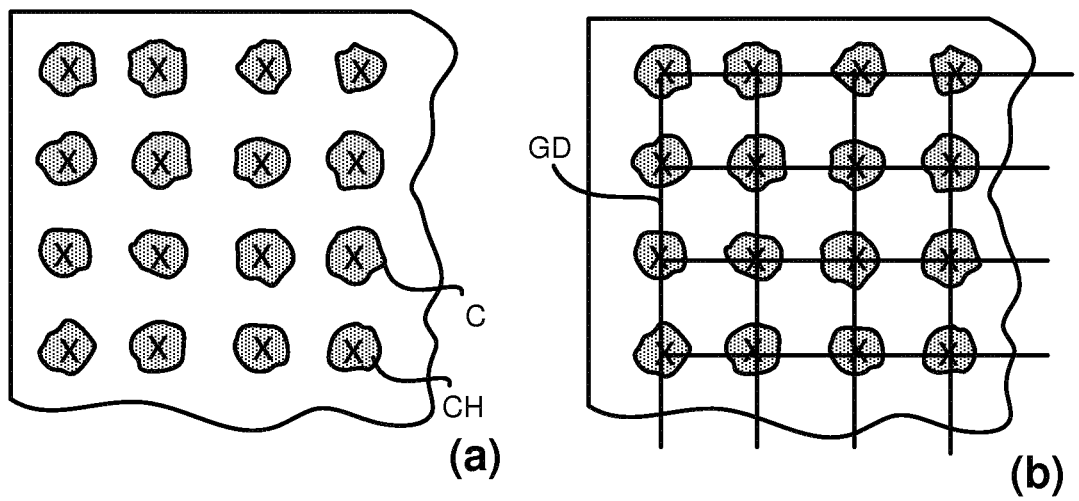
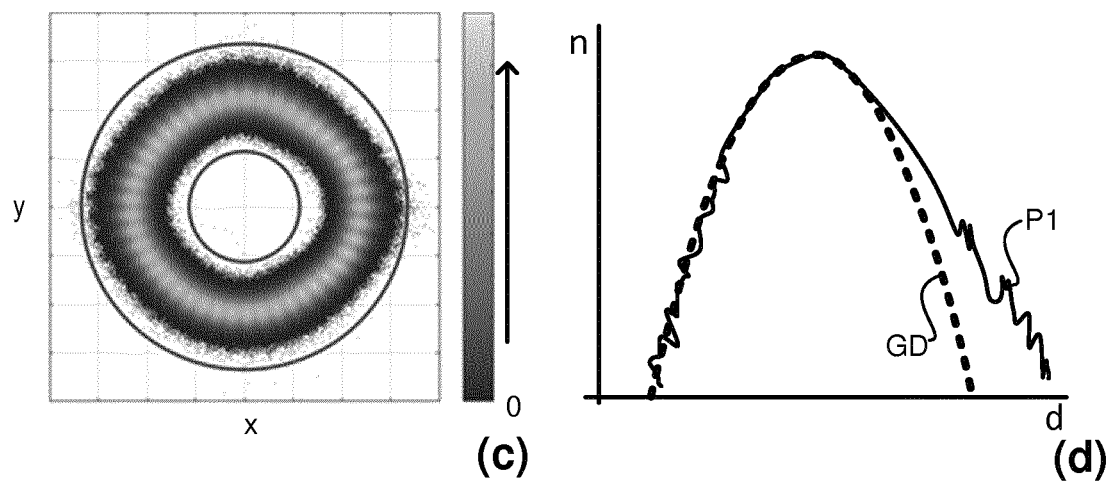
Fig. 3

METHOD FOR CONTROLLING A MANUFACTURING APPARATUS AND ASSOCIATED APPARATUSES

CROSS-REFERENCE TO RELATED APPLICATIONS

This application is the U.S. national phase entry of PCT Patent Application No. PCT/EP2018/084109, which was filed on Dec. 10, 2018, which claims the benefit of priority of European Patent Application No. 17207267.0 which was filed on Dec. 14, 2017, and which is incorporated herein in its entirety by reference.

BACKGROUND

Field of the Invention

The present invention relates to methods and apparatus for applying patterns to a substrate in a lithographic process.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth or critical dimension (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY OF THE INVENTION

In a first aspect of the invention there is provided a method of predicting the dominant failure mode and/or the failure rate of a plurality of features formed on a substrate, the method comprising: determining a placement metric for each feature, the placement metric comprising a measure of whether the feature is in an expected position; comparing a placement metric distribution to a reference distribution, the placement metric distribution comprising a distribution of the placement metric; and predicting the dominant failure mode and/or the failure rate of the plurality of features from said comparison.

In a second aspect of the invention, there is provided a computing apparatus comprising a processor, and being configured to perform the method of the first aspect.

In a third aspect of the invention, there is provided an inspection apparatus being operable to image a plurality of features on a substrate, and comprising the computing apparatus of the second aspect.

In a fourth aspect of the invention, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which:

FIG. 2(a) depicts part of a contact hole array showing a missing contact hole and a contact hole with large inward excursion;

FIG. 2(b) depicts part of a contact hole array showing a pair of touching contact holes and a contact hole with large outward excursion;

FIG. 3(a) depicts a first step of an exemplary method wherein the centers of each contact hole are identified;

FIG. 3(b) depicts a second step of an exemplary method wherein the expected centers of each contact hole are identified;

FIG. 3(c) comprises a two dimensional histogram of the position of the actual boundary points with respect to a corresponding expected feature center, as may be determined in a third step of an exemplary method;

FIG. 3(d) comprises a histogram of the position of the actual boundary points with respect to the expected feature center for the same data represented by FIG. 3(c) integrated over all angles, and a Gaussian distribution, as may be determined in a fourth step of an exemplary method;

DETAILED DESCRIPTION

Before describing embodiments of the invention in detail, it is instructive to present an example environment in which embodiments of the present invention may be implemented.

Figure 1:
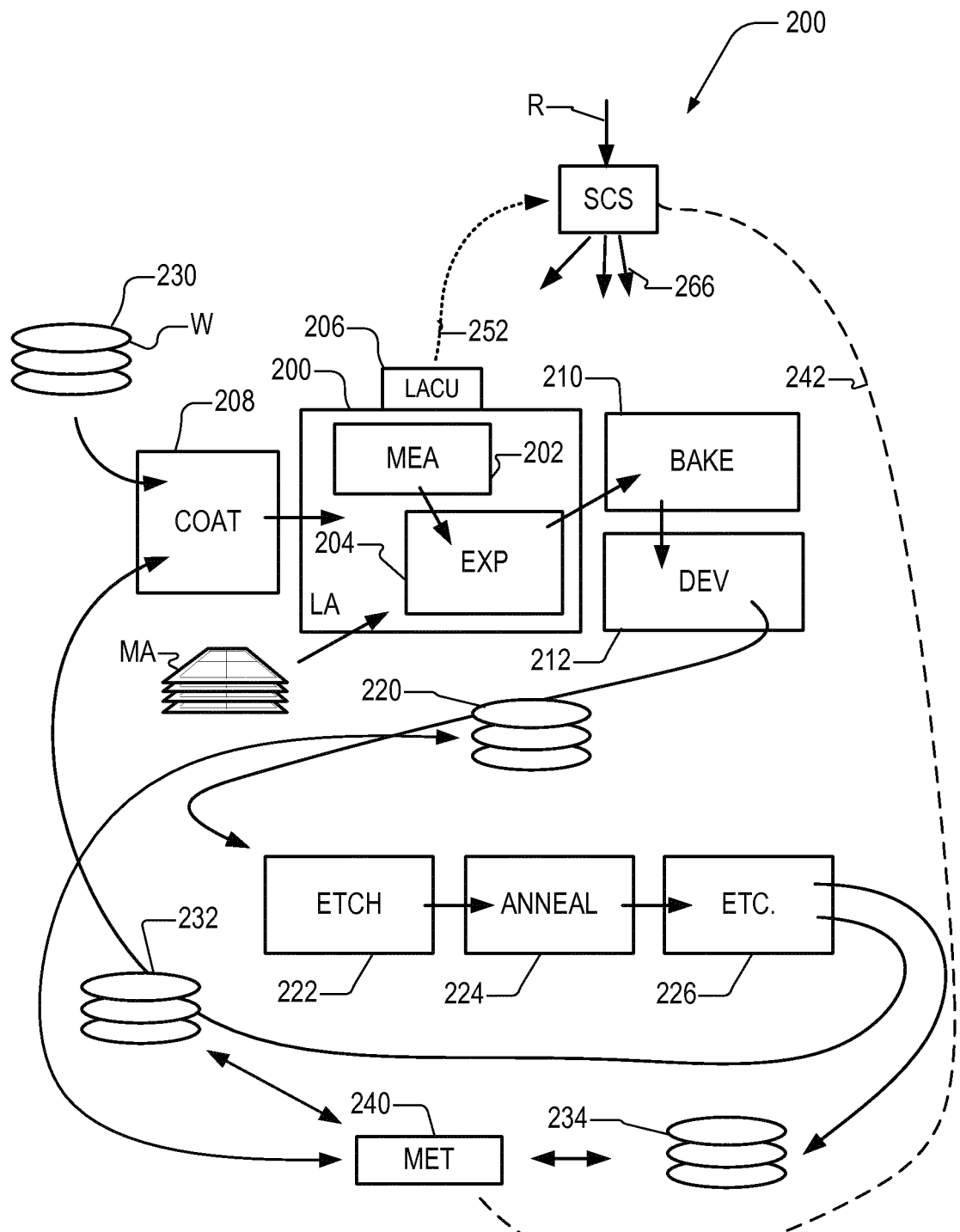
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Another example of a metrology station is a scanning electron microscope (SEM) or an electron beam (e-beam) metrology device, either (or both) of which may be included in addition to, or as an alternative to, a scatterometer. As such, metrology apparatus 240 may comprise an e-beam or SEM metrology device, either alone or in addition to a scatterometer. E-beam and SEM metrology devices have the advantage of measuring features directly (i.e., they directly image the features), rather than the indirect measurement techniques used in scatterometry (where parameter values are determined from reconstruction from and/or asymmetry in diffraction orders of radiation diffracted by the structure being measured). The main disadvantage with e-beam or SEM metrology devices is their measurement speed, which is much slower than scatterometry, limiting their potential application to specific offline monitoring processes.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

In a lithography process for manufacturing certain devices (e.g., regularly structured devices such as memory devices), one or more layers comprising a regular array of contact holes typically need to be formed. It is important that these contact holes are formed correctly as badly formed contact holes may render a device defective. Contact holes failures do occur due to the stochastic nature of the lithography process. Two particular failure modes are illustrated in FIG. 2, which shows part of an array of contact holes CH. The two failure modes are (near) missing contact holes MCH, illustrated in FIG. 2(a) and "kissing" or touching contact holes TCH (i.e., neighbouring contact holes which are touching), illustrated in FIG. 2(b). Note that contact holes do not need to be entirely missing to be deemed a missing contact hole defect, only substantially missing (e.g., significantly smaller than is required to be functional).

Stochasticity is of greater importance for extreme ultraviolet (EUV) lithography, as features are smaller relative to lithography techniques using lower energy exposure radiation, as is the number of photons in the exposure radiation (because of their higher energy). EUV radiation is electromagnetic radiation having a wavelength within the range of 5-20 nm; for example within the range of 13-14 nm. It has further been proposed that EUV radiation with a wavelength of less than 10 nm could be used, for example within the range of 5-10 nm (e.g., 6.7 nm or 6.8 nm). Such radiation is termed extreme ultraviolet radiation or soft x-ray radiation. Possible sources for EUV radiation include, for example, laser-produced plasma sources, discharge plasma sources, or sources based on synchrotron radiation provided by an electron storage ring.

At present, when studying contact hole failure rates, either the number of failures is reported, or the variation of the CD (so called Local CD Uniformity, LCDU). Accurate measurement of the number of failures is cumbersome, as low failure rates (e.g., of the order of 1 per million to 1 per billion) can be expected in an optimized process. Therefore, efforts are made to link the failure rate to LCDU, and especially to the tails in a CD distribution. However, this has been largely unsuccessful.

Currently, about ten million contact holes need to be measured to obtain reliable statistics on the low failure rates. This is prohibitive for high volume manufacture (HVM), and is even inconvenient in research environments. Therefore it would be desirable to identify early predictors which could indicate the most likely failure mode and the failure rate from a much smaller number of measurements. Such predictors and associated failure prediction methods are disclosed herein.

It can be demonstrated that large excursions of the boundary defining the contact hole are correlated to failure rates. FIG. 2(b) shows, in addition to the touching contact holes TCH, a contact hole $CH_{LEO}$ having a large, outward boundary excursion (here to the left). It can therefore be appreciated that touching contact holes TCH will comprise a pair of such contact holes, each with a large boundary excursion toward the other contact hole. The probability of finding a pair of touching contact holes is therefore the probability of finding two large excursions in neighboring contact holes. This probability is the square of the probability of finding a single large boundary excursion. This implies that the probability of finding a large boundary excursion enables prediction of the overall failure rate. Moreover, this implies that the probability of finding single large excursions is much larger than the probability of finding touching contact holes (because the former is the square of the latter). This means that large boundary excursions are a more practical metric to measure than touching contact holes. A similar reasoning can be applied with regard to missing contact holes MCH; these can be interpreted as contact holes with two large, inward excursions. A contact hole with a single large, inward boundary excursion $CH_{LEI}$ is also shown in FIG. 2(a), for illustration. Throughout the remainder of this description, the term boundary excursion will be used to describe large boundary excursions; i.e., large enough to be indicative of a defective hole.

Described herein is an improved method of predicting the failure mode and/or failure rate of features in a layer, based on the distribution of a feature's placement metric (i.e., a placement metric distribution) rather than the distribution of the feature CD. The method may comprise comparing the placement metric distribution to a reference distribution. In a specific embodiment, the reference distribution may comprise a normal (i.e., Gaussian) distribution. Alternatively, the reference distribution may comprise a Poisson distribution or distribution derived from a Gaussian distribution or a Poisson distribution. For example, the reference distribution may comprise a compound Poisson distribution (it will be appreciated that both a Poisson distribution or compound Poisson distribution will approach a Gaussian distribution for a large average), or else a suitable transformation of the Gaussian distribution (e.g., a distribution which can be written as a distribution of f(X), where X is Gaussian distributed and f is a quadratic function). It will be appreciated that these are only examples of a reference distribution, and any distribution from which it is possible to distinguish a prominent tail (see below) of a placement metric distribution, can be used as a reference distribution. However, in the examples below, the reference distribution used is a Gaussian distribution.

Comparing a distribution of the placement metric to a reference distribution may comprise comparing a best fit to the distribution data with a Gaussian fit to the same or similar data (e.g., where similar data may be features formed by the same process but using a different process parameter value, such as defocus). The placement metric may comprise a measure of whether a feature is in an expected position. The placement metric may comprise a boundary metric for a plurality of boundary points on the boundary defining each feature, the boundary metric comprising a measure of whether a boundary point is in an expected position.

In a more specific embodiment, disclosed herein is a method for predicting failure mode and/or failure rates of contact holes based on the distribution of boundary points defining each contact hole, rather than the CD distribution. Such a method may directly use the contact hole contour information, instead of only a single number derived from the contour (i.e. CD or ellipse fit).

In an embodiment, it is proposed to construct a map of the distribution of boundary points for each feature, where the features here are contact holes. FIG. 3 illustrates how this may be done. Firstly, using the SEM image, the contour C and center (marked by X) of each contact hole CH is determined, as illustrated in FIG. 3(a). Following this, a regular grid GD is best fitted to the image as illustrated in FIG. 3(b). In this specific example, the regular grid GD is fitted to the imaged contact hole centers, although it may be fitted to other reference points on the image. This grid GD defines the expected center of each contact hole (or other reference); e.g., at each line intersection, based on the positions of the other contact holes. Subsequent to this, a two-dimensional histogram of the boundary position (over the whole boundary—i.e., at all angles) with respect to the expected center of the contact hole can be plotted for each contact hole CH. Such a two-dimensional histogram is shown in FIG. 3(c), where lighter shading indicates a higher count as illustrated by the arrow. From this histogram, it can be seen that there are a number of large boundary excursions, and that most of these large boundary excursions are outward excursions of the boundary in the horizontal (x) direction. Moreover, it can be observed that the distribution has an angular dependency.

FIG. 3(d) shows a histogram plot or distribution P1 of the number of occurrences n of each actual distance d to a corresponding expected center, corresponding to the histogram of FIG. 3(c) but integrated over all angles (alternatively the distribution may be represented per-angle or otherwise). An equivalent Gaussian distribution GD is also shown; e.g., a Gaussian fit to the same data. A comparison of distribution P1 to the Gaussian distribution GD clearly shows a prominent tail (in the specific example of a Gaussian reference distribution: a non-Gaussian tail) for distribution P1 in the region of larger outward excursions (where outward excursions are right of center of the curve's peak and inward excursions are left of center).

Figure 4:
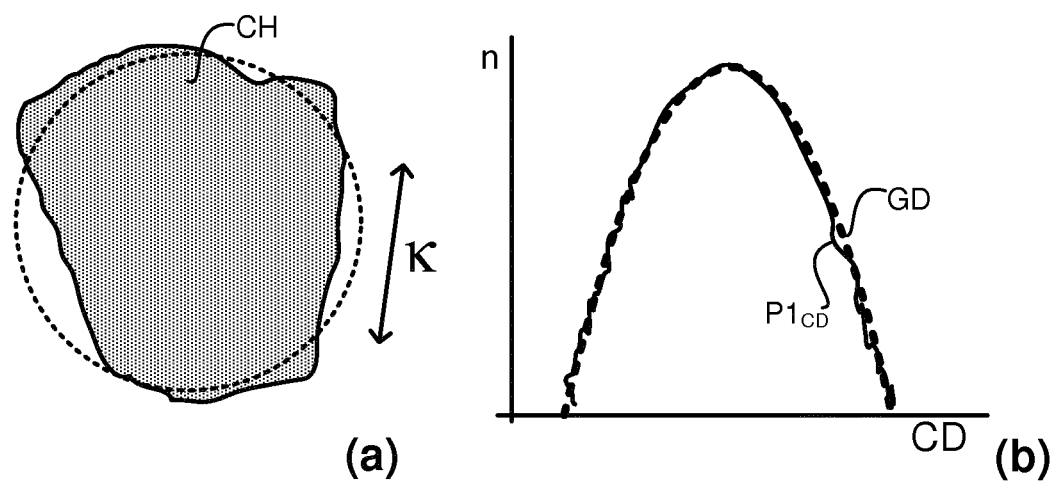
FIG. 4(a) shows an exemplary actual contour of a contact hole boundary against an expected contour of a contact hole boundary.
FIG. 4(b) comprises a histogram of the CD of each contact hole for the same data represented by FIGS. 3(c) and 3(d)

FIG. 4(a) shows the actual shape of an exemplary contact hole CH with respect to a perfect circle (dotted) representing an expected contour. It can be appreciated that the boundary of a contact hole can be described in terms of a circle having a number of boundary excursions. The contour of the boundary excursion can be seen to have a correlation length κ, where correlation length is the length over which the distance d (to the expected center) for any pair of boundary points can be expected to show a certain degree of correlation. Therefore, it may be appreciated that the boundary is comprised of several independent boundary excursions, each with a width (on average) equal to correlation length κ. The data shows that for a contact hole having an average CD of 22.4 nm, the number of boundary excursions can be expected to be in the region of 5.4. Typically, the CD is derived from the surface area of the contact hole. Therefore, the CD could be interpreted as an average over these 5.4 boundary excursions of the boundary. It is very unlikely that a single contact hole will have more than one exceptionally large excursion that is in the far tail of the distribution. As CD averages over 5.4 excursions, the deviation of the CD due to the large excursion is typically 5.4 times smaller than the excursion itself.

This averaging effect is illustrated in FIG. 4(b), which shows a histogram distribution $P1_{CD}$ which is equivalent to distribution P1 of FIG. 3(d), in that the distribution $P1_{CD}$ relates to the same data as distribution P1. However for distribution $P1_{CD}$, the actual metric plotted is CD, i.e., it is the number of occurrences of CD values (on the x axis) which is shown. While FIG. 3(b) showed a prominent (non-Gaussian) tail in the distribution P1, this is not the case for distribution $P1_{CD}$, which shows virtually no deviation from the normal Gaussian distribution GD. This means that CD distribution is not a good metric for predicting failure rates or modes using the methods described herein.

Figure 5:
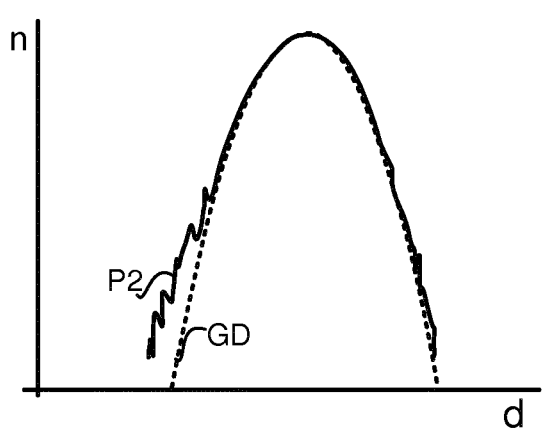
FIG. 5 comprises a histogram of the distance of the actual boundary points to the expected center and a Gaussian distribution, for a data set for which missing contact holes is the dominant failure mode.

FIG. 5 shows a second distribution P2 describing the number of occurrences n of each actual value for distance to expected center d, integrated over all angles (although again a histogram for a single angle could be used). FIG. 5 also shows a Gaussian Distribution GD fitted to the same data. This second distribution P2 relates to a data set for which the failure mode has been observed to be dominated by missing contact holes. This is in contrast to the example of distribution P1 (see FIG. 3(d)), where the failure mode had been observed to be dominated by touching contact holes. Comparison of distribution P1 with distribution P2 shows that the dominant failure mode can be predicted by the direction of the non-Gaussian tail; i.e., which side of the peak it is located. A non-Gaussian tail on the outside of the peak (distribution P1), corresponding to higher than average values for d, signifies touching contact holes, whereas a non-Gaussian tail on the inside of the peak (distribution P2), corresponding to lower than average values for d, signifies missing contact hole failures. As such, it is proposed in an embodiment, to predict the dominant failure mode by determining the direction of the non-Gaussian tail of the distribution.

Figure 6:
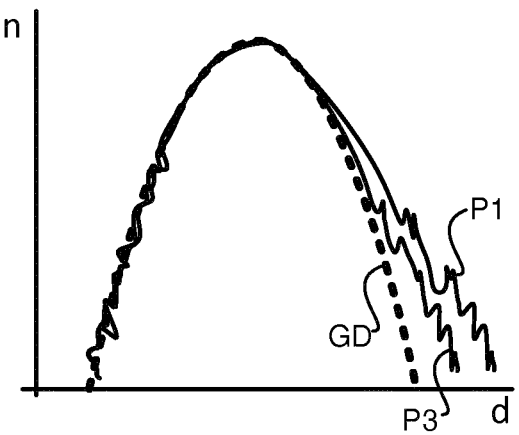
FIG. 6 comprises two histograms of actual boundary position versus expected center integrated over all angles, each histogram relating to a different defocus level, and a Gaussian distribution for the same data as represented by FIGS. 3(c), 3(d) and 4(b)

FIG. 6 shows the distribution P1 (i.e., as represented in FIG. 3(d)), which relates to a first defocus setting during formation of the contact holes, and a further distribution P3 relating to a second defocus setting during formation of the contact holes. The second defocus setting is closer to the best focus setting for this particular arrangement compared to the first defocus setting. A manual count of the failure rate shows that the first defocus setting results in a greater failure rate (more touching contact holes) than the second defocus setting. Once again, a Gaussian distribution GD is shown for comparison. In this example the Gaussian distribution GD comprises a Gaussian fit to the data relating to the first defocus setting. However, it will be appreciated that it matters very little as to which data set (or combination thereof) that the Gaussian curve is fitted to, as the distributions will largely overlap for more than half of the distribution (here for all lower values of d extending beyond the peak). Therefore the Gaussian fit will essentially have the same or very similar form whichever data set to which it is fitted.

FIG. 6 shows that the relative rate of failure can also be estimated using the methodology proposed herein, by determining the prominence of the non-Gaussian tail (i.e., the degree to which the tail is non-Gaussian). As can be seen in FIG. 6, the non-Gaussian tail for distribution P1 is more prominent (deviates further from a Gaussian distribution GD) than the non-Gaussian tail for distribution P3. As such, it is proposed, in an embodiment, to predict the failure rate using the methodology proposed herein, based on the prominence of the non-Gaussian tail of the histogram distribution (obtained in accordance with methods described herein), wherein more prominent tails signify greater failure rates. This applies to both failure modes (i.e., tails in either direction).

It will be appreciated that, in an embodiment, a focus and/or dose setting (or any other process parameter setting of the lithographic process which may affect formation of contact holes, or other features) may be optimized by determining a distribution for each of a number of different settings/values of a process parameter, and comparing the prominence of the non-Gaussian tails of each distribution. As such, the parameter setting with the least prominent non-Gaussian tail may be selected. Such an optimization may be improved by modelling the variation of non-Gaussian tail prominence with variation of the process parameter so as to minimize the non-Gaussian tail prominence, therefore minimizing the contact hole failure rate.

It should be appreciated that the specific implementation described above, which considers the distribution of boundary points with respect to the (expected) center of the contact hole, is only one of a number of possible implementations of predicting the failure mode and/or failure rate of a contact hole layer according to this disclosure. Other embodiments and implementations are envisaged within the scope of this disclosure.

In an embodiment, for example, instead of considering the distance to the center of the contact hole, the distribution of the distance between the actual boundary contour and an expected boundary contour may be considered. Such a method may comprise determining the distance between each point on the boundary with a corresponding point on the expected boundary contour (e.g., the actual boundary contour of contact hole CH and the expected boundary contour depicted by the dotted circle, as shown in FIG. 4(a)). This has an additional benefit of extending utility of this methodology to failure rate/mode prediction of features other than (near-) circular contact holes. In fact it will be appreciated that the reference feature from which the boundary points are measured from is not critical and may comprise any suitable reference feature, including features other than expected center or expected boundary contour. For example, other reference features may include the distance to a neighboring contact hole or other feature.

Alternatively, the boundary metric used may be the curvature of the boundary contour (e.g., the degree of curvature at each boundary point). For example, boundary points for which the boundary contour is highly curved may be assumed to have a high (or at least higher) probability of being indicative of a boundary excursion.

Another placement metric which may be used, instead of the boundary metrics described herein, is the placement error of the entire feature; i.e., a measure of the distance of the entire feature from an expected position for that feature.

Figure 7:
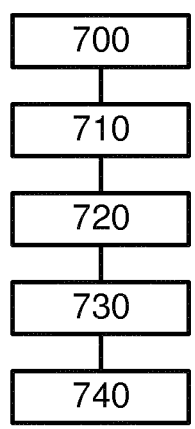
FIG. 7 is a flowchart describing a method according to an embodiment of the invention.

FIG. 7 is a flowchart describing an exemplary method according to an embodiment. At step 700, a boundary metric (or other placement metric) is measured. The boundary metric may comprise a measure of whether a boundary point is in an expected position. As such, the boundary metric may describe the actual position the feature's boundary relative to an expected position, or it may relate to the shape (degree of curvature) of the boundary. At step 710, a distribution of the boundary metric is determined, and at step 720 this distribution is compared to a Gaussian distribution. At step 730, a non-Gaussian tail is identified (assuming present) and the failure mode is determined from the direction of the non-Gaussian tail. At step 740, the prominence of the non-Gaussian tail is determined and the failure rate is inferred. The method may be repeated for different process parameter settings (e.g., focus and/or dose) and the non-Gaussian tales compared for prominence, so as to optimize the process parameter setting.

It can be demonstrated that number of contact holes that require measurement using the methods described herein is of the order of magnitude of about 10000 contact holes, this being typically sufficient to determine the non-Gaussian tail of the distribution. This is many (e.g., approximately 3-4) orders of magnitude fewer than the number of contact holes which require measurement in previous methods (e.g., individually measuring each contact hole) to determine failure modes and failure rates in contact hole layers.

The embodiments may further be described using the following clauses:

1. A method of predicting the dominant failure mode and/or the failure rate of a plurality of features formed on a substrate, the method comprising:

determining a placement metric for each feature, the placement metric comprising a measure of whether the feature is in an expected position;

comparing a placement metric distribution to a reference distribution, the placement metric distribution comprising a distribution of the placement metric; and predicting the dominant failure mode and/or the failure rate of the plurality of features from said comparison.

2. A method according to clause 1, wherein the comparison step comprises determining whether the placement metric distribution has a prominent tail, a prominent tail being a tail of the placement metric distribution which deviates significantly from the reference distribution.

3. A method according to clause 2, wherein the comparison step comprises predicting the dominant failure mode of the plurality of features based on which side of the peak of the placement metric distribution and/or reference distribution is the prominent tail.

4. A method according to clause 3, wherein the dominant failure mode is one of touching contact hole dominant or missing contact hole dominant.

5. A method according to any of clauses 2 to 4, wherein said identification step comprises predicting the failure rate from the prominence of the prominent tail, the prominence of the prominent tail being a measure of the degree to which said prominent tail deviates from the reference distribution.

6. A method according to clause 5, comprising inferring a greater failure rate from a greater prominence of the prominent tail.

7. A method according to clause 5 or 6, comprising optimizing a process parameter of a process for forming said plurality of features by minimizing the prominence of said prominent tail.

8. A method according to clause 7, wherein said optimization step comprises performing said method for different pluralities of features, each of the different plurality of features being formed with a different value of said process parameter, and determining prominence of said prominent tail for placement metric distributions relating to each plurality of features.

9. A method according to clause 8, comprising modelling the dependence of the prominence of the prominent tail on variation of the process parameter.

10. A method according to any of clauses 7 to 9, wherein the process parameter comprises one or both of focus and dose of projection optics used to expose the plurality of features.

11. A method according to any preceding clause, wherein each feature is defined by a boundary, and said placement metric comprises a boundary metric for a plurality of boundary points on the boundary of each feature, the boundary metric comprising a measure of whether a boundary point is in an expected position.

12. A method according to clause 11, wherein said boundary metric comprises the distance of each boundary point to a corresponding reference point.

13. A method according to clause 12, wherein said corresponding reference point comprises a corresponding expected feature center.

14. A method according to clause 13, wherein the expected feature center is determined by best fitting a regular grid to an image of the plurality of features, such that each grid intersection defines an expected feature center.

15. A method according to clause 12, wherein said corresponding reference point comprises a corresponding expected boundary point.

16. A method according to clause 12, wherein said corresponding reference point comprises a point on a neighboring feature.

17. A method according to clause 11, wherein said boundary metric comprises a measure of the degree of curvature at each boundary point.

18. A method according to any of clauses 11 to 17, wherein the position of boundary points of each feature is obtained from an image of the boundary of features.

19. A method according to clause 18, wherein the image comprises a scanning electron microscope or e-beam metrology image.

20. A method according to any of clauses 1 to 10, wherein said placement metric comprises placement error describing the distance of the full feature from an expected position of the full feature.

21. A method according to any preceding clause, wherein said plurality of features comprise an array of contact holes.

22. A method according to any preceding clause, wherein the number of features measured to determine the placement metric distribution is of an order of magnitude of $10^4$.

23. A method according to any preceding clause, wherein the reference distribution comprises one of:
a Gaussian distribution,
a Poisson distribution, or
a distribution derived from a Gaussian distribution or a Poisson distribution.

24. A computing apparatus comprising a processor, and being configured to perform the method of any preceding clause.

25. An inspection apparatus being operable to image a plurality of features on a substrate, and comprising the computing apparatus of clause 24.

26. An inspection apparatus according to clause 25 comprising a scanning electron microscope or electron beam apparatus.

27. A computer program comprising program instructions operable to perform the method of any of clauses 1 to 22 when run on a suitable apparatus.

28. A non-transient computer program carrier comprising the computer program of clause 27. The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of predicting a dominant failure mode and/or a failure rate of a plurality of features formed on a substrate, the method comprising:
determining a value of a placement metric for each feature, the placement metric comprising a measure of whether the feature is in an expected position;
comparing a placement metric distribution to a reference distribution, the placement metric distribution comprising a distribution of the values of the placement metric; and
predicting the dominant failure mode and/or the failure rate of the plurality of features from the comparison.

2. The method as claimed in claim 1, wherein the comparing comprises determining whether the placement metric distribution has a prominent tail, a prominent tail being a tail of the placement metric distribution which deviates significantly from the reference distribution.

3. The method as claimed in claim 2, wherein the comparing comprises predicting the dominant failure mode of the plurality of features based on which side of the peak of the placement metric distribution and/or reference distribution is the prominent tail.

4. The method as claimed in claim 2, wherein the comparing comprises predicting the failure rate from the prominence of the prominent tail, the prominence of the prominent tail being a measure of a degree to which the prominent tail deviates from the reference distribution.

5. The method as claimed in claim 4, further comprising optimizing a process parameter of a process for forming the plurality of features by reducing or minimizing the prominence of the prominent tail.

6. The method as claimed in claim 5, wherein the process parameter comprises focus and/or dose of projection radiation used to expose the plurality of features.

7. The method as claimed in claim 1, wherein each feature is defined by a boundary, and the placement metric comprises a boundary metric for a plurality of boundary points on the boundary of each feature, the boundary metric comprising a measure of whether a boundary point is in an expected position.

8. The method as claimed in claim 7, wherein the boundary metric comprises a distance of each boundary point to a corresponding reference point.

9. The method as claimed in claim 8, wherein the corresponding reference point comprises a corresponding expected feature center, or wherein the corresponding reference point comprises a corresponding expected boundary point, or wherein the corresponding reference point comprises a point on a neighboring feature.

10. The method as claimed in claim 7, wherein the boundary metric comprises a measure of a degree of curvature at each boundary point.

11. The method as claimed in claim 1, wherein the placement metric comprises placement error describing a distance of the feature from an expected position of the feature.

12. The method as claimed in claim 1, wherein the plurality of features comprise an array of contact holes.

13. The method as claimed in claim 1, wherein the reference distribution comprises one of:
   a Gaussian distribution,
   a Poisson distribution, or
   a distribution derived from a Gaussian distribution or a Poisson distribution.

14. A computer program product comprising a non-transitory computer-readable medium having instructions therein, the instructions, upon execution by a computing apparatus, configured to cause the computing apparatus to at least:
   determine a value of a placement metric for each feature of a plurality of features formed on a substrate, the placement metric comprising a measure of whether the feature is in an expected position;
   compare a placement metric distribution to a reference distribution, the placement metric distribution comprising a distribution of the values of the placement metric; and
   predict a dominant failure mode and/or a failure rate of the plurality of features from the comparison.

15. The computer program product as claimed in claim 14, wherein the instructions configured to cause the computer apparatus to compare a placement metric distribution to a reference distribution are further configured to cause the computer apparatus to determine whether the placement metric distribution has a prominent tail, a prominent tail being a tail of the placement metric distribution which deviates significantly from the reference distribution.

16. The computer program product as claimed in claim 15, wherein the instructions configured to cause the computer apparatus to compare a placement metric distribution to a reference distribution are further configured to cause the computer apparatus to predict the dominant failure mode of the plurality of features based on which side of the peak of the placement metric distribution and/or reference distribution is the prominent tail.

17. The computer program product as claimed in claim 15, wherein the instructions configured to cause the computer apparatus to compare a placement metric distribution to a reference distribution are further configured to cause the computer apparatus to predict the failure rate from the prominence of the prominent tail, the prominence of the prominent tail being a measure of a degree to which the prominent tail deviates from the reference distribution.

18. The computer program product as claimed in claim 17, wherein the instructions are further configured to cause the computer apparatus to optimize a process parameter of a process for forming the plurality of features by reducing or minimizing the prominence of the prominent tail.

19. The computer program product as claimed in claim 14, wherein each feature is defined by a boundary, and the placement metric comprises a boundary metric for a plurality of boundary points on the boundary of each feature, the boundary metric comprising a measure of whether a boundary point is in an expected position.

20. An inspection apparatus operable to image a plurality of features on a substrate, and comprising a processor and the computer program product of claim 14.

* * * * *